US007598320B2

(12) United States Patent
Nishikawa et al.

(10) Patent No.: US 7,598,320 B2
(45) Date of Patent: Oct. 6, 2009

(54) PROTECTED POLYVINYL ALCOHOL AUXILIARY FOR FORMING FINE PATTERN AND PROCESS FOR PRODUCING THE SAME

(75) Inventors: Masato Nishikawa, Kakegawa (JP); Kiyohisa Takahashi, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 562 days.

(21) Appl. No.: 10/550,110

(22) PCT Filed: Mar. 18, 2004

(86) PCT No.: PCT/JP2004/003650

§ 371 (c)(1), (2), (4) Date: Sep. 19, 2005

(87) PCT Pub. No.: WO2004/087773

PCT Pub. Date: Oct. 14, 2004

(65) Prior Publication Data

US 2006/0211814 A1 Sep. 21, 2006

(30) Foreign Application Priority Data

Mar. 28, 2003 (JP) ............................ 2003-090376

(51) Int. Cl.

*C08F 16/00* (2006.01)
*C08F 8/00* (2006.01)
*C08F 6/00* (2006.01)
*C08L 29/00* (2006.01)
*G03F 7/40* (2006.01)

(52) U.S. Cl. ............................ 525/56; 525/60; 525/61; 525/62

(58) Field of Classification Search .................. 525/56, 525/60, 61, 62

See application file for complete search history.

(56) References Cited

U.S. PATENT DOCUMENTS 3,104,205 A 9/1963 Hainer et al.
3,666,473 A 5/1972 Colom et al.
4,812,551 A 3/1989 Oi et al.
4,823,345 A 4/1989 Daniel et al.
5,035,881 A 7/1991 Mori et al.
5,294,444 A 3/1994 Nakamura et al.
5,538,820 A 7/1996 Fisher
5,547,812 A 8/1996 Collins et al.
5,585,219 A 12/1996 Kaimoto et al.
5,777,060 A 7/1998 Van Antwerp
5,820,491 A 10/1998 Hatch et al.
5,843,624 A 12/1998 Houlihan et al.
5,858,620 A 1/1999 Ishibashi et al.
5,863,707 A 1/1999 Lin
6,080,707 A 6/2000 Glenn et al.
6,090,772 A 7/2000 Kaiser et al.
6,136,499 A 10/2000 Goodall et al.
6,147,249 A 11/2000 Watanabe et al.
6,180,244 B1 1/2001 Rayner et al.
6,274,286 B1 8/2001 Hatakeyama et al.
6,319,853 B1 11/2001 Ishibashi et al.
6,365,332 B1 4/2002 Price et al.
6,447,980 B1 9/2002 Rahman et al.
6,555,607 B1 4/2003 Kanda et al.
6,579,657 B1 6/2003 Ishibashi et al.
6,727,034 B1 4/2004 Ogiso et al.

(Continued)

FOREIGN PATENT DOCUMENTS

DE 101 37 855 A1 2/2003

(Continued)

OTHER PUBLICATIONS

Machine English Language Translation of Claim for JP 36-22145, 1991.

(Continued)

*Primary Examiner*—Kelechi C Egwim
(74) *Attorney, Agent, or Firm*—Sangya Jain

(57) ABSTRACT

A modified polyvinyl alcohol (PVA) protected with a protecting group of the present invention is one wherein an amount of high-molecular weight body components of the modified polyvinyl alcohol having a weight-average molecular weight of 250,000 or more as determined by polyethylene glycol standards according to a gel permeation chromatography is 1000 ppm or less in the modified polyvinyl alcohol. The modified PVA is prepared by removing a metal ion and an acid from the modified PVA such as acetalized PVA with ion exchange treatment and then heat-treating at 80° C. or higher. An auxiliary for fine pattern formation of the present invention comprises the aforementioned modified PVA, a water-soluble crosslinking agent, and water or a mixed solvent of water and a water-soluble organic solvent. The auxiliary for fine pattern formation is applied over a resist pattern 3 and a coated layer 4 is formed thereon. Then the resist pattern 3 and the coated layer 4 are heated and thereby an acid is diffused from the resist pattern 3 to the coated layer 4. As a result, the coated layer in the vicinity of the resist pattern surface is crosslinked and cured by the diffused acid. The coated layer is developed to form a hole pattern having crosslinked and cured layer on the resist pattern, of which the hole size is less than a limit resolution of the wavelength of a light-exposure and which have no development defects.

9 Claims, 1 Drawing Sheet

U.S. PATENT DOCUMENTS

| | | | |
|---|---|---|---|
| 6,811,817 | B2 | 11/2004 | Sugeta et al. |
| 6,818,258 | B2 | 11/2004 | Kaneko et al. |
| 6,916,590 | B2 | 7/2005 | Kaneko et al. |
| 7,141,177 | B2 | 11/2006 | Tanaka |
| 7,226,726 | B2 | 6/2007 | Kanda |
| 2001/0037008 | A1 | 11/2001 | Sherman et al. |
| 2001/0044070 | A1 | 11/2001 | Uetani et al. |
| 2002/0192591 | A1 | 12/2002 | Komatsu et al. |
| 2003/0008968 | A1 | 1/2003 | Sugeta et al. |
| 2003/0091732 | A1 | 5/2003 | Kanda |
| 2003/0102285 | A1 | 6/2003 | Nozaki et al. |
| 2003/0129538 | A1 | 7/2003 | Sheu et al. |
| 2004/0121259 | A1 | 6/2004 | Kozawa et al. |
| 2006/0088788 | A1 | 4/2006 | Kudo et al. |
| 2006/0160015 | A1 | 7/2006 | Takano et al. |
| 2006/0183218 | A1 | 8/2006 | Takahashi et al. |
| 2006/0211814 | A1 | 9/2006 | Nishikawa et al. |
| 2007/0059644 | A1 | 3/2007 | Takahashi et al. |
| 2008/0193880 | A1 | 8/2008 | Nishibe et al. |

FOREIGN PATENT DOCUMENTS

| | | | | |
|---|---|---|---|---|
| DE | 696 23 456 | T2 | | 8/2003 |
| EP | 0 250 248 | | | 12/1987 |
| EP | 1 223 470 | A1 | | 7/2002 |
| JP | 36022145 | B | * | 11/1961 |
| JP | 51-125154 | | | 11/1976 |
| JP | 51-125155 | | | 11/1976 |
| JP | 51125154 | A | * | 11/1976 |
| JP | 51125155 | A | * | 11/1976 |
| JP | 61-173376 | U | | 10/1986 |
| JP | 63-278911 | | | 11/1988 |
| JP | 1-221750 | A | | 9/1989 |
| JP | 3-200805 | | | 9/1991 |
| JP | 03200805 | A | * | 9/1991 |
| JP | 36-22145 | | | 11/1991 |
| JP | 5-241348 | | | 9/1993 |
| JP | 6-81173 | A | | 3/1994 |
| JP | 6-250379 | | | 9/1994 |
| JP | 9-235318 | A | | 9/1997 |
| JP | 9-244262 | | | 9/1997 |
| JP | 9-325502 | A | | 12/1997 |
| JP | 10-73927 | | | 3/1998 |
| JP | 10-120968 | A | | 5/1998 |
| JP | 10-158328 | A | | 6/1998 |
| JP | 11-38642 | A | | 2/1999 |
| JP | 11-283910 | A | | 10/1999 |
| JP | 2001-089520 | | | 4/2001 |
| JP | 2001-228616 | A | | 8/2001 |
| JP | 2001-304841 | A | | 10/2001 |
| JP | 2002-23389 | A | | 1/2002 |
| JP | 2003-140363 | A | | 5/2003 |
| WO | WO 96/34029 | | | 10/1996 |
| WO | WO 97/40103 | | | 10/1997 |
| WO | WO 02/077072 | A1 | | 10/2002 |
| WO | WO 03/018704 | A1 | | 3/2003 |

OTHER PUBLICATIONS

English Language abstract of JP 3-200805, 1991.
English Language abstract of JP 5-241348, 1993.
English Language abstract of JP 6-250379, 1994.
English Language abstract of JP 51-125154, 1976.
English Language abstract of JP 51-125155, 1976.
English Language abstract of JP 63-278911, 1988.
English Language abstract of JP 2001-089520, 2001.
English Derwent Abstract AN2003-268185 [26], corres. to DE 101 37 855 A1.
English Derwent Abstract AN2003-312878 [30] corres. to WO 03/018704 A1.
Patent Abstracts of Japan corres. to JP 10110023 A.
English Derwent Abstract AN 1996-497582 [49] corres. to DE 696 23456 T2.
I. Yilgör, Polymer, 1984 (25), pp. 1800-1817.
Macromolecules 1993, 26, pp. 7029-7036.
English Language Abstract of JP 1-221750 A, Sep. 5, 1989.
English Language Abstract of JP 6-81173 A, Mar. 22, 1994.
English Language Abstract of JP 9-235318 A, Sep. 9, 1997.
English Language Abstract of JP 9-244262 A, Sep. 19, 1997.
English Language Abstract of JP 9-325502 A, Dec. 16, 1997.
English Language Abstract of JP 10-120968 A, May 12, 1998.
English Language Abstract of JP 10-158328 A, Jun. 16, 1998.
English Language Abstract of JP 11-283910 A, Oct. 15, 1999.
English Language Abstract of JP 11-38642 A, Feb. 12, 1999.
English Language Abstract of JP 61-173376 U, Oct. 28, 1986.
English Language Abstract of JP 2001-228616 A, Aug. 24, 2001.
English Language Abstract of JP 2001-304841 A, Oct. 31, 2001.
English Language Abstract of JP 2002-23389 A, Jan. 23, 2002.
English Language Abstract of JP 2003-140363 A, May 14, 2003.
Notification of Transmittal of the International Search Report and the Written Opinion of the International Searching Authority, or the Declaration (Form PCT/ISA/220); International Report (Form PCT/ISA/210); and Written Opinion of the International Searching Authority (Form PCT/ISA/237) for PCT/IB2006/003347.
Substantive/Modified Substantive Examination and Search Report (in English) for Malaysian patent application No. PI 20013263.
English Translation (and original language document) of Pre-Notification of Reasons for Possible Rejection of the Pending Patent Examination dated Mar. 19, 2004; of Decision on Examination dated May 20, 2004; and of Pre-Notification of Reasons for Possible Rejection of the Pending Patent Re-Examination dated Nov. 3, 2005 for Taiwanese patent application No. 90111701.
Mori, CAPLUS AN1994:617650.
Skofronick et al. CAPLUS AN 1969:492865.

* cited by examiner

PROTECTED POLYVINYL ALCOHOL AUXILIARY FOR FORMING FINE PATTERN AND PROCESS FOR PRODUCING THE SAME

This application is a United States National Stage Patent Application under 35 U.S.C. § 371 of International Patent Application No. PCT/JP2004/003650, filed Mar. 18, 2004, which claims priority to Japanese Patent Application No. 2003-090376, filed Mar. 28, 2003, the contents of all documents being hereby incorporated herein by reference.

TECHNICAL FIELD

The present invention relates to an auxiliary for fine pattern formation which is used in a pattern forming method by which a resist pattern with a pattern size of a resolution limit or less of a light-exposure wavelength can be formed by applying the auxiliary on a photoresist pattern to thicken the photoresist pattern in a fine processing upon manufacturing electronic parts such as a semiconductor and so on or a three-dimensional fine structured article such as a micro machine, and to a raw material polymer for the auxiliary and a production method of the raw material polymer.

BACKGROUND ART

Photolithography technology has so far generally been employed in a fine processing upon manufacturing electronic parts such as a semiconductor and so on, a three-dimensional fine structured article and the like. In a photolithography method, a positive-working or negative-working radiation sensitive resin composition is used to form a resist pattern. Among these radiation sensitive resin compositions, a radiation sensitive resin composition comprising, for example, an alkali-soluble resin and a quinone diazide compound which is a photosensitive substance is widely being used as a positive-working photoresist.

By the way, in recent years, along with the tendencies which induce high degree of integration and high process speed of LSI, fining of the design rule is being required such as a quarter-micron or further finer in the field of manufacturing microelectronic devises. In order to respond to further fining of a design rule, light sources so far applied such as a visible light or a near-ultraviolet light (wavelength; 400 to 300 nm) and so on are not enough as a light-exposure source. Therefore it is getting necessary to use a deep ultraviolet ray such as KrF excimer laser (248 nm), ArF excimer laser (193 nm) and so on or further shorter wavelength radiation such as X-rays and electron beams, and then a lithographic process using these light sources has been proposed and has been coming into practice. In order to respond to the further fining of this design rule, higher resolution is also being required for a radiation sensitive resin composition that is used as a photoresist upon fine processing. Further, besides high resolution, an improvement of performance such as sensitivity and accuracy of image dimension are being required to a radiation sensitive resin composition in the same time. In order to respond it, "a chemically amplified radiation sensitive resin composition" was proposed as a radiation sensitive resin composition having a high resolution and being sensitive to the radiation with short wavelength. This chemically amplified radiation sensitive resin composition contains a compound that generates an acid by irradiation of radiation and is advantageous in obtaining a high sensitivity by an image-formation step brought by the catalytic action of the acid generated from this acid generating compound by irradiation of radiation. Therefore the chemically amplified radiation sensitive resin composition is taking the place of the radiation sensitive resin composition so far applied and is prevailing.

However, a pattern formation with a KrF excimer laser (248 nm) has not been catching up with a fine pattern size currently being required and there is a situation that a process by an ArF excimer laser (193 nm) has not yet been coming into practice. In this connection, a fine resist pattern forming method as follows is being proposed. That is, first a resist pattern is formed by use of a chemically amplified resist according to a pattern forming process with a KrF excimer laser. Next a water-soluble resin film is formed over the resist pattern by applying on the resist pattern an auxiliary for a fine pattern formation that is a water-soluble resin composition to be crosslinked or cured by an acid. The resist pattern and the auxiliary are full-exposed without a mask and/or heated and an acid is made diffused from the resist pattern into the water-soluble resin film, thereby the water-soluble resin film is crosslinked or cured to be made insoluble in a developer. Thereafter uncured area is removed by a development to thicken the resist pattern, eventually to narrow widths between resist patterns, and thereby a fining of a resist pattern is realized and a fine resist pattern below a resolution limit of a light-exposure wavelength is practically and effectively formed (see, for example, Japanese laid-open Patent Publication Nos. Hei 5-241348, Hei 6-250379 and Hei 10-73927.).

This method is being paid attention as a useful method since it is not required to invest facilities of a high price such as a light-exposure device for a short wavelength and is possible to reduce a dimension of a space area of a resist pattern effectively. This auxiliary for a fine pattern formation comprising a water-soluble resin composition applied for a formation of a fine pattern has been already placed on the market such as RELACS series (manufactured by Clariant Japan K.K.), for example.

The aforementioned auxiliary contains a modified polyvinyl alcohol which is water- or alkali-soluble and is protected with a protecting group (hereafter simply called "modified polyvinyl alcohol" sometimes) as a component. On the other hand, it is known that polyvinyl alcohol generates an associated body by a hydrogen bond. This associated body is a kind of a high molecular gel and may be regarded as a body to be swollen with a solvent having a three dimensional network structure, in which the system is all over connected by a hydrogen bond. And polyvinyl alcohol is a crystalline polymer, and a crosslinked point thereof is thought to be an entangled point trapped among micro crystallites. This associated body is very tough in an aqueous solution, might cause defects such as a reduction of filtration speed upon using a filter of a size of 0.1 μm or less and so on, and a problem to be a cause of a foreign matter in an applied film. Furthermore, this associated body has a problem of stability with time that it is likely to be formed again even after the associated body is once removed.

The modified polyvinyl alcohol which is used as a raw material of an auxiliary for fine pattern formation contains a high molecular weight body component based on the association in the same way as a polyvinyl alcohol, and has problems in a filtration property and stability with time. Therefore the auxiliary for fine pattern formation which was prepared by using this modified polyvinyl alcohol has the same problems as polyvinyl alcohol described above. Furthermore, concerning the auxiliary for fine pattern formation which was prepared by using this modified polyvinyl alcohol, there is another problem that an application defect takes place upon applying it on a substrate. In addition, there is further problem of a development defect in a pattern based on residue of an unnecessary auxiliary for fine pattern formation, which is not removed upon removal of the uncured auxiliary for fine pattern formation by development after applying the auxiliary for fine pattern formation on the resist pattern and then exposing it to light, followed by heating and so on, and remained on the resist pattern.

Accordingly an object of the present invention is to offer an auxiliary for fine pattern formation on which the above-described problems are solved, namely which is good in a filtration property, has less number of application defects and development defects, is good in stability with time and can be used for a manufacture of a semiconductor.

Another object of the present invention is to offer a modified polyvinyl alcohol which is used as a constitutional material in the above-described auxiliary for fine pattern formation and is excellent in filterability and stability with time, and the production method thereof.

DISCLOSURE OF INVENTION

As a result of eager study and examination, the present inventors found that the above-described auxiliary having preferable characteristics can be obtained in the case where the content of a high molecular weight body component having the weight-average molecular weight of over 250,000 as determined by polyethylene glycol standards measured according to a gel permeation chromatography (GPC) method in the modified polyvinyl alcohol is less than the determine amount in an auxiliary for fine pattern formation containing a modified polyvinyl alcohol, and further the modified polyvinyl alcohol having such characteristics can be obtained by carrying out a heat treatment after removal of impurities from the modified polyvinyl alcohol if necessary to reach the present invention.

It means that the present invention relates to an auxiliary for fine pattern formation comprising a modified polyvinyl alcohol protected with a protecting group, a water-soluble crosslinking agent and water or a mixed solvent of water and a water-soluble organic solvent, wherein the content of a high molecular weight body component having the weight-average molecular weight of over 250,000 as determined by polyethylene glycol standards measured according to a gel permeation chromatography (GPC) method in the modified polyvinyl alcohol protected with a protecting group is 1000 ppm or less in the modified polyvinyl alcohol.

And also the present invention relates to the above-described auxiliary for fine pattern formation, wherein the modified polyvinyl alcohol protected with a protecting group is one that was treated so as to remove acid components and metal ions therefrom.

And also the present invention relates to the modified polyvinyl alcohol protected with a protecting group, wherein the amount of high molecular weight body components having weight-average molecular weight of 250,000 or more as determined by polyethylene glycol standards according to a gel permeation chromatography is 1,000 ppm or less.

And also the present invention relates to a method of producing the modified polyvinyl alcohol protected with a protecting group, wherein a solution of modified polyvinyl alcohol protected with a protecting group is heat-treated at the temperature of 80° C. or more.

And also the present invention relates to the method of producing modified polyvinyl alcohol protected with a protecting group, wherein the solution of modified polyvinyl alcohol protected with a protecting group is heat-treated after a step of removing acid components and metal ions from the solution.

DETAILED DESCRIPTION OF THE INVENTION

Figure 1:
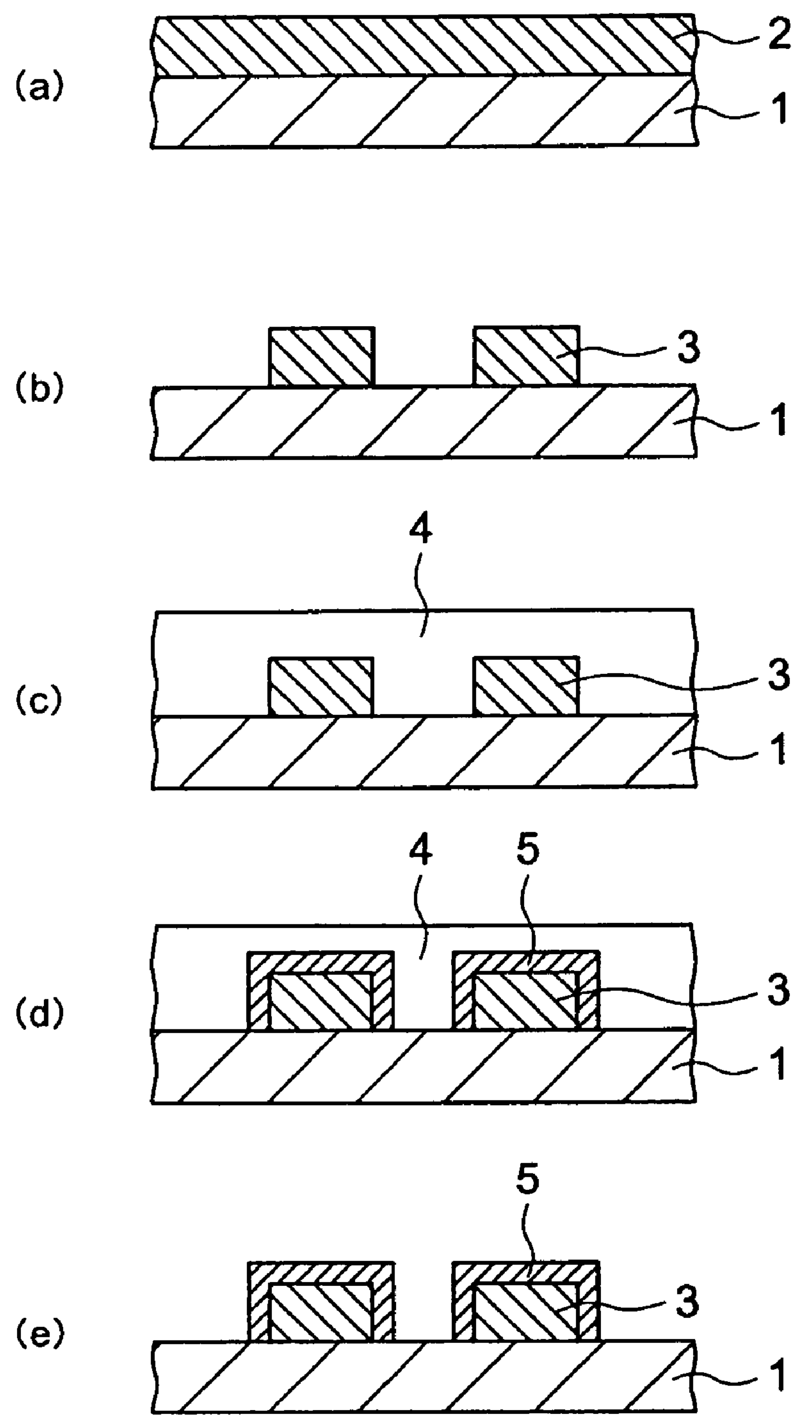
FIG. 1 is a figure explaining steps to thicken a resist pattern by using an auxiliary for fine pattern formation, to narrow a size of gap between a resist pattern and a resist pattern and to form a resist pattern having a space width between patterns with a limit resolution or less.

The present invention will be explained further in details in the following.

In the present invention, as a protecting group of the modified polyvinyl alcohol protected with a protecting group, there can be illustrated a formyl group, an acetyl group, a malonyl group, a benzoyl group, a cynnamoyl group, a formal group, an acetal group, a butyral group, a t-butoxycarbonyl group, an ethoxyethylene group and so on. In modified polyvinyl alcohols protected with these protecting groups, the content of a high molecular weight body component having the weight-average molecular weight of over 250,000 as determined by polyethylene glycol standards measured according to a gel permeation chromatography (GPC) method (hereafter simply called “the weight-average molecular weight according to GPC”) needs to be 1000 ppm or less relative to the modified polyvinyl alcohol and the high molecular content is preferably 100 ppm or less. When the content of a high molecular weight component having a weight-average molecular weight according to GPC of 250,000 or more exceeds 1000 ppm, an auxiliary for fine pattern formation excellent in filterability, an application characteristic and a development characteristic cannot be obtained. Such modified polyvinyl alcohol, wherein the content of a high molecular weight body component having the weight-average molecular weight of 250,000 or more according to GPC is 1000 ppm or less, can be produced by reacting polyvinyl alcohol with a compound forming a protecting group to form thereby a protecting group and thereafter carrying out a heat treatment at 80° C. or higher, preferably at 90° C. or higher. Furthermore, in order to obtain the modified polyvinyl alcohol excellent in stability with time, it is required to remove impurities in the polymer solution by a removal treatment of acid components and metal ions before carrying out a heat-treatment.

Both of the modified polyvinyl alcohols protected with a protecting group such as a formyl group, an acetyl group, a malonyl group, a benzoyl group, a cynnamoyl group, a formal group, an acetal group, a butyral group, a t-butoxycarbonyl group, an ethoxyethylene group and so on and the production methods thereof themselves are widely known. The modified polyvinyl alcohols to be heat-treated and be treated for removal of acid components and metal ions may be any one which is prepared according to any methods so far known. For example, a polyvinyl alcohol having an acetal group as a protecting group is prepared by dissolving the polyvinyl alcohol into water and carrying out the reaction with acetaldehyde in the presence of acids. A formal group or a butyral group can also be introduced by the reaction of a polyvinyl alcohol with formaldehyde or butylaldehyde in the same manner as the above-described introductory method of the acetal group. As the modified polyvinyl alcohol used in the present invention is required to be water-soluble, it is necessary to control a degree of modification, e.g. a degree of acetalization in an adequate range, in order to make the modified polyvinyl alcohol water-soluble after reaction. This requirement is the same in an introduction of other protecting groups. Examples of preferable protecting groups in the present invention are a formal group, an acetal group and a butyral group. As polyvinyl alcohols to be used for the production of the modified polyvinyl alcohol, polyvinyl alcohols having a polymerization degree of 300 to 2400, preferably 500 to 1000 and a saponification degree of 70 to 99 mole %, preferably 88 to 95 mole % are usually used.

The heat treatment condition in the production of the modified polyvinyl alcohol of the present invention is 80° C. or higher, preferably 90° C. or higher. In the case where a treating temperature is less than 80° C., a content of a high molecular weight body component in a modified polyvinyl alcohol after the heat treatment is not reduced substantially. As a result, when an auxiliary for fine pattern formation is constituted by using this polymer, properties of the auxiliary such as application defects, development defects and filterability are inferior to an auxiliary for fine pattern formation heat-treated at 80° C. or higher. Time of heat treatment may not be particularly restrained since it varies with heat treatment temperature, however is preferably 5 minutes or longer and more preferably 15 minutes or longer. The modified polyvinyl alcohol is dissolved in a solvent and the heat treatment is carried out in the state of a solution. Usually water is used as a solvent, the concentration is made to about 5 to 20% and the heat-treatment is conducted.

A removal treatment of impurities such as acids and metal ions in a modified polyvinyl alcohol, which is carried out prior to heating, can be made by treating the modified polyvinyl alcohol solution with an ion exchange resin, for example. Many kinds of resins are already known as the ion exchange resin applied for such removal treatment of acids and metal ions. In the present invention, the removal treatment of acids and metal ions can be carried out by applying any one of ion exchange resins so far known or well known. The concentrations of metal ions and acids in the modified polyvinyl alcohol after removal treatment of impurities are preferably 1.0 ppm or less for the former and 50 ppm or less, preferably 5 ppm or less for the latter.

In the auxiliary for fine pattern formation of the present invention, a water-soluble crosslinking agent and a solvent are contained besides these treated modified polyvinyl alcohols. The water-soluble crosslinking agent can be any one which can crosslink or cure the modified polyvinyl alcohols and form a developer-insoluble film by an acid. Examples of the water-soluble crosslinking agent include melamine derivatives, guanamine derivatives, urea derivatives, glycol uril, alkoxy alkylated amino resin and so on as preferable ones.

Among these water-soluble crosslinking agents, as the melamine derivatives, there are illustrated melamine, methoxy methylated melamine, ethoxy methylated melamine, propoxy methylated melamine, butoxy methylated melamine hexamethylol melamine and so on. As the guanamine derivatives, there are illustrated acetoguanamine, benzoguanamine and methylated benzoguanamine and so on. As the urea derivatives, there are illustrated urea, monomethylol urea, dimethylol urea, alkoxy methylene urea, N-alkoxy methylene urea, ethylene urea, and ethylene urea carboxylic acid and so on.

On the other hand, examples of the alkoxy alkylated amino resin include alkoxy alkylated melamine resin, alkoxy alkylated benzoguanamine resin, alkoxy alkylated urea resin and so on and specific examples thereof include methoxy methylated melamine resin, ethoxy methylated melamine resin, propoxy methylated melamine resin, butoxy methylated melamine resin, ethoxy methylated benzoguanamine resin, methoxy methylated urea resin, ethoxy methylated urea resin, propoxy methylated urea resin, butoxy methylated urea resin and so on.

These water-soluble crosslinking agents can be used singly or in a combination of two or more thereof, and the compounding amount thereof is 1 to 70 parts by weight, preferably 10 to 33 parts by weight relative to 100 parts by weight of the modified polyvinyl alcohol.

As a solvent, water or a mixed solvent of water and a water-soluble organic solvent is used. As regards water used as a solvent, there is no particular limit if it is water, however water from which organic impurities and metal ions are removed by a distillation, an ion exchange treatment, a filter treatment, a various kind of absorption treatment or the like, for example pure water is preferred. On the other hand, the water-soluble organic solvent may be any solvent capable of being dissolved at 0.1% by weight or more in water. As the organic solvent which can be used in the present invention, there are illustrated, for example, alcohols such as methyl alcohol, ethyl alcohol, n-propyl alcohol, isopropyl alcohol (IPA) and so on; ketones such as acetone, methyl ethyl ketone, 2-heptanone, cyclohexanone and so on; esters such as methyl acetate, ethyl acetate and so on; ethylene glycol monoalkyl ethers such as ethylene glycol monomethyl ether, ethylene glycol monoethyl ether and so on; ethylene glycol monoalkyl ether acetates such as ethylene glycol monomethyl ether acetate, ethylene glycol monoethyl ether acetate and so on; propylene glycol monoalkyl ethers such as propylene glycol monomethyl ether, propylene glycol monoethyl ether and so on; propylene glycol monoalkyl ether acetates such as propylene glycol monomethyl ether acetate, propylene glycol monoethyl ether acetate and so on; lactic esters such as methyl lactate, ethyl lactate and so on; aromatic hydrocarbons such as toluene, xylene and so on; amides such as N,N-dimethylacetamide, N-methylpyrrolidone and so on; lactones such as γ-butyrolactone and so on. As preferable organic solvents, there are illustrated $C_{1-4}$ lower alcohols such as methyl alcohol, ethyl alcohol, n-propyl alcohol, isopropyl alcohol, N,N-dimethylformamide, dimethylsulfoxide and so on. These organic solvents can be used singly or in a combination of two or more thereof. These solvents are used at the amount where they do not dissolve a resist pattern.

And also additives such as a surfactant may be incorporated in the auxiliary for fine pattern formation of the present invention, if necessary. Examples of the surfactant include Fluorad manufactured by 3M Co., Ltd., Nonypol manufactured by Sanyo Kasei kogyo K.K., Megafac manufactured by Dai-Nippon Ink & Chemicals, Inc., acetylene alcohols, acetylene glycols, polyethoxylate of acetylene alcohols, and polyethoxylate of acetylene glycols.

The auxiliary for fine pattern formation of the present invention comprises 1 to 30 parts by weight of a modified polyvinyl alcohol which was heat-treated or impurity removal-treated and heat-treated, preferably 2 to 15 parts by weight, and 0.01 to 10 parts by weight of a water-soluble crosslinking agent, preferably 0.1 to 5 parts by weight relative to 100 parts by weight of water or a mixture of water and a water soluble solvent.

The resist pattern on which the auxiliary for fine pattern formation of the present invention is applied may be one formed according to the methods so far known or well known. An example thereof will be explained by referring to FIGS. 1(*a*) and (*b*). First as shown in FIG. 1(*a*), a chemically amplified radiation sensitive resin composition is applied on a substrate to be processed, for example a semiconductor substrate 1, and pre-bake is carried out, if necessary (for example, at a baking temperature of 70 to 150° C. for a minute and like)

to form a photoresist layer 2. Next, after exposing to light through a photo-mask which is not illustrated in the figure, the photoresist layer is post-exposure baked (PEB) (for example, at a baking temperature of 50 to 150° C.) if necessary, developed, and post-development baked (for example, at a baking temperature of 60 to 120° C.) if necessary, to form a positive resist pattern 3 as shown in FIG. 1(*b*).

The semiconductor substrate to be used for forming a resist pattern described above may be a bare semiconductor substrate or a substrate of a silicon or the like having a silicon oxide layer, a metal layer such as aluminum, molybdenum, chromium and so on, a metal oxide layer such as ITO and so on, and a silicon layer such as polysilicon on the surface thereof, if necessary and further a substrate on which a circuit pattern or a semiconductor element is formed. The application of a chemically amplified radiation sensitive resin composition is made according to the methods so far publicly known such as a spin coating method, a roll coating method, a land coating method, a flow and spread coating method, a dip coating method and so on. Examples of light-exposure sources to be used include deep ultra violet light such as a KrF excimer laser, an ArF excimer laser, X-rays, electron beams and so on. Furthermore, a developer for a photoresist film may be any one which can develop a chemically amplified radiation sensitive resin composition to be applied, and usually an alkali aqueous solution of tetramethyl ammonium hydroxide, sodium hydroxide or the like is used. A development method may be any one so far applied for a development of a photoresist such as a paddle method or a spray method. By the way, a radiation sensitive resin composition may be one where in acids are diffused from a resist pattern 3 into a coated layer 4 by the exposure and/or heating after forming the resist pattern and is not limited to the above-described chemically amplified positive-working radiation sensitive resin composition.

In the next step, the method wherein a coated layer which is crosslinked with an acid on the resist pattern is formed and the distance between resist patterns is narrowed to form a pattern having a width below a limit resolution of a light-exposure wavelength will be explained by referring to FIG. 1(*c*) to (*e*). First, as shown in FIG. 1(*c*), the auxiliary for fine pattern formation of the present invention is applied on a resist pattern 3, baked, if necessary (for example, at a baking temperature of 65 to 85° C. for about a minute) to form a coated layer 4. Next, exposed to light and/or baked (for example, at a baking temperature of 90 to 140° C. for about a minute) in order to diffuse acids from the resist pattern 3 into the coated layer 4. Thereby acids are diffused from the resist pattern 3 to form a crosslinked or cured layer 5 on the coated layer 4 as shown in FIG. 1(*d*). The coated layer 4 is developed with a developer for an exclusive use, the coated layer which is neither crosslinked nor cured is removed to form a pattern which was thickened by the crosslinked or cured layer 5 as shown by FIG. 1(*e*), eventually the space between resist patterns is narrowed to form a pattern having a width below a limit resolution of light-exposure wavelength. The formed pattern is used as a resist-mask for a fine processing of a substrate or resist masks for treatment such as an etching mask, an ionic implantation mask and so on.

BEST MODE FOR CARRYING OUT THE INVENTION

The present invention will now be described more specifically by reference to Examples which, however, are not to be construed to limit the present invention in any way.

Production Example [Production of Acetalized Polyvinyl Alcohol]

Polyvinyl alcohol (PVA) of saponification value, 88% and degree of polymerization, 500 manufactured by Nippon Synthetic Chemical Industry Co., Ltd. was reacted with acetaldehyde to acetalize in the presence of hydrochloric acid catalyst. Then the reaction product was neutralized with an aqueous sodium hydroxide solution and a modified PVA of acetalization ratio, 30 mole % (polymer a) was synthesized. A sodium ion content in polymer a was 28 ppm, an acetic acid ion content was 1,250 ppm and a chlorine ion content was 221 ppm.

In the next step, the polymer a was demetal-ionization treated with an ion exchange resin, Amberlight EG-290 manufactured by Organo Corp. to remove metal ions, then it was deacidification-treated with an ion exchange resin, Amberlyst IRA96SB manufactured by Organo Corp. in order to remove acids to obtain a modified PVA from which metal ions and acids were removed (polymer A). Polymer A was finally prepared to be an aqueous solution with 10% concentration. By the above-described ion exchange treatment, a sodium ion content in the modified PVA was reduced from 28 ppm to 5 ppb, an acetic acid content was reduced from 1,250 ppm to 41 ppm, and a chlorine ion content was reduced from 221 ppm to 1 ppm or less.

By the way, the sodium ion content was measured according to an atomic absorption method and the acetic acid ion and chlorine ion contents were measured according to an ion chromatography method.

EXAMPLE 1

1 kg of 10 weight-% aqueous solution of Polymer A was put into a three neck flask, and was heat-treated at 100° C. in an oil bath for 180 minutes to obtain Polymer B. A measurement of a high molecular weight body component with a weight average molecular weight of 250,000 or higher according to GPC (hereafter simply referred to as "a high molecular weight body component") in the Polymer B and an evaluation of filterability was made as follows. The results were shown in Table 1.

Measurement of a High Molecular Weight Body Component in the Polymer:

LC module-1 (manufactured by Waters Co.) was applied as a GPC measurement device, and SB-800P, SB-804HQ, SB-803HQ and SB-802.5HQ (all manufactured by Showa Denko Co., Ltd.) were applied as a column. An eluate was prepared by adding 1 part by weight of acetonitrile into 9 parts by weight of 0.1 mole/liter aqueous sodium nitrate solution. Flow speed was made to be 0.8 milliliter (ml)/minute (min), injection rate of a sample was made to be 200 micro-liter (μl) and the column temperature was made to be at 40° C.

A measurement was made by dissolving 0.50 g of 10 weight-% aqueous solution of Polymer B into 10 ml of an eluate, carrying out a separation according to a molecular weight by GPC in the above-described condition and detecting and calibrating a high molecular weight body component with the weight average molecular weight of 250,000 or higher as determined by polyethylene glycol standards. A calibration was made by calculating based on an area ratio of a high molecular weight body component of the weight average molecular weight of 250,000 or higher as determined by polyethylene glycol standards relative to a main peak area.

Evaluation of Filterability

A change of filtering speed of 3 weight-% aqueous solution of Polymer B was inspected by carrying out a pressure-filtration at 1.4 kgf/cm$^2$ of nitrogen pressure with a filter made of polytetrafluoroethylene (PTFE) with pore size of 0.20 μm and diameter of 13 mm (manufactured by Mikrolis Co.). An evaluation of filterability was made by measuring a filtered amount for one minute of 2-3 minutes after a start of a filtration and a filtered amount for one minute of 9-10 minutes after a start of a filtration, comparing these values and evaluating according to the criteria described below.

[Evaluation Criteria of Filterability]

○: Reduced amount of a filtered amount for one minute of 9-10 minutes after a start of filtration towards a filtered amount for one minute of 2-3 minutes after a start of a filtration is 30% or less.

X: Reduced amount of a filtered amount for one minute of 9-10 minutes after a start of filtration towards a filtered amount for one minute of 2-3 minutes after a start of a filtration exceeds 30%.

EXAMPLE 2

1 kg of 10 weight-% aqueous solution of Polymer A was put into a three neck flask, and it was heat-treated at 100° C. in an oil bath for 15 minutes to obtain Polymer C. GPC measurement was carried out in the same manner as Example 1 and an amount of a high molecular weight body component in the Polymer C was obtained. An evaluation of filterability of polymer C was made in the same manner as Example 1. The results were shown in Table 1.

EXAMPLE 3

1 kg of 10 weight-% aqueous solution of Polymer A was put into a three neck flask, and it was heat-treated at 80° C. in an oil bath for 180 minutes to obtain Polymer D. GPC measurement was carried out in the same manner as Example 1 and an amount of a high molecular weight body component in the Polymer D was obtained. An evaluation of filterability of Polymer D was made in the same manner as Example 1. The results were shown in Table 1.

COMPARISON EXAMPLE 1

GPC measurement of Polymer A obtained in the Production Example was carried out in the same manner as Example 1 and a high molecular weight body component in the Polymer A was obtained. An evaluation of filterability of Polymer A was made in the same manner as Example 1. The results were shown in Table 1.

COMPARISON EXAMPLE 2

1 kg of 10 weight-% aqueous solution of Polymer A was put into a three neck flask, and it was heat-treated at 60° C. in an oil bath for 180 minutes to obtain Polymer E. GPC measurement was carried out in the same manner as Example 1 and an amount of a high molecular weight body component in the Polymer E was obtained. An evaluation of filterability of Polymer E was made in the same manner as Example 1. The results were shown in Table 1.

TABLE 1

| | Polymer | Heating Temperature (° C.) | Heating Time (min.) | Amount of High molecular weight body component | Evaluation of filterability |
|---|---|---|---|---|---|
| Example 1 | B | 100 | 180 | 100 or less | ○ |
| Example 2 | C | 100 | 15 | 100 or less | ○ |
| Example 3 | D | 80 | 180 | 300 | ○ |
| Comparative Example 1 | A | — | — | 2700 | X |
| Comparative Example 2 | E | 60 | 180 | 2400 | X |

From Table 1, it is seen that by heat-treating a modified PVA at the temperature of 80° C. or higher an amount of a high molecular weight body component in the polymer is drastically reduced and that the modified PVA of the present invention having reduced amount of a high molecular weight body component shows extremely good in a filterability.

EXAMPLE 4

[Preparation of an Auxiliary for Fine Pattern Formation]

100 parts by weight of Polymer B obtained in Example 1 and 19 parts by weight of a water-soluble crosslinking agent of a urea derivative were dissolved in 1,470 parts by weight of a mixed solvent of pure water and isopropyl alcohol which is a water-soluble solvent (5 parts by weight of isopropyl alcohol relative to 95 parts by weight of pure water) to prepare an auxiliary B for fine pattern formation (Composition B).

Next, Composition B was put into "Defects inspection after application" and "Defects inspection after development" below.

[Defects Inspection after Application]

Composition B was spin-coated on a bare 8-inch silicon wafer, followed by pre-baking it at 85° C. for 70 seconds on a direct hotplate to form a film of 0.35 μm in thickness. Inspection of defects of the coated film was carried out by use of a surface defects inspector KLA-2115 manufactured by KLA Tencor Co. An evaluation of number of defects after application was carried out with all application defect number on the wafer. The result was shown in Table 2.

[Defects Inspection after Development]

AZ KrF-17B80 manufactured by Clariant Co. ("AZ" is a registered trademark, hereafter the same) was spin-coated on a bare 8-inch silicon wafer, followed by baking it at 180° C. for 60 seconds on a direct hotplate to prepare an anti-reflective coating of 0.080 μm in thickness. Further AZ DX5240P (7cP) manufactured by Clariant Co. was spin-coated thereon, followed by pre-baking it at 90° C. for 60 seconds on a direct hotplate to form a resist film of 0.450 μm in thickness. The resist film was exposed to light through a binary mask selectively by KrF excimer laser of 248.4 nm in wavelength, followed by carrying out a post exposure bake (PEB) at 120° C. for 60 seconds on a direct hotplate, and paddle-developing using AZ 300MIF manufactured by Clariant Co. (a 2.38 weight-% tetramethylammonium hydroxide aqueous solution) for 60 seconds to form a hole pattern on the silicon wafer. Composition B was spin-coated on this hole pattern and baked at 85° C. for 70 seconds on a direct hotplate to form a film of 0.350 μm in thickness. Next, after conducting a bake (mixing bake) on a direct hotplate at 110° C. for 70 seconds in order to promote a crosslinking reaction at the interface between the resist layer and the auxiliary for fine pattern formation, a water stream development with AZ R2 developer manufactured by Clariant Co. was carried out for 60 seconds to form a fine pattern. By using a surface defects inspector KLA-2115 manufactured by KLA Tencor Co., a measurement of defects inspection after development was carried out. An evaluation of defect number after development was made by regarding as a defect after development in the case where a pattern was not developed completely and a bridge was formed on a hole pattern, and regarding the number of the total defects on a wafer as the number of defects after development. The result was shown in Table 2.

EXAMPLE 5

The same manner was taken as Example 4 except applying Polymer C obtained in Example 2 instead of Polymer B to prepare an auxiliary C for fine pattern formation (Composition C). In the same manner as Example 4, "Defects inspection after application" and "Defects inspection after development" of the Composition C were carried out. The results were shown in Table 2.

EXAMPLE 6

The same manner was taken as Example 4 except applying the Polymer D obtained in Example 3 instead of Polymer B to prepare an auxiliary D for fine pattern formation (Composition D). In the same manner as Example 4, "Defects inspection after application" and "Defects inspection after development" of the Composition D were carried out. The results were shown in Table 2.

COMPARATIVE EXAMPLE 3

The same manner was taken as Example 4 except applying the Polymer A which was not heat-treated and obtained in the Production Example instead of Polymer B to prepare an auxiliary A for fine pattern formation (Composition A). In the same manner as Example 4, "Defects inspection after application" and "Defects inspection after development" of the Composition A were carried out. The results were shown in Table 2.

COMPARATIVE EXAMPLE 4

The same manner was taken as Example 4 except applying the Polymer E obtained in Comparative Example 2 instead of Polymer B to prepare an auxiliary E for fine pattern formation (Composition E). In the same manner as Example 4, "Defects inspection after application" and "Defects inspection after development" of the Composition E were carried out. The results were shown in Table-2.

TABLE 2

| | Polymer | Amount of High molecular weight body component (ppm) | Number of defects after application (pieces/wafer) | Number of defects after development (pieces/wafer) |
|---|---|---|---|---|
| Example 4 | B | 100 or less | 50 | 65 |
| Example 5 | C | 100 or less | 55 | 72 |
| Example 6 | D | 300 | 75 | 84 |
| Comparative Example 3 | A | 2700 | 160 | 183 |
| Comparative Example 4 | E | 2400 | 112 | 146 |

From Table 2, it is seen that the number of application defects upon application and formation of patterns and the number of development defects are drastically improved for the auxiliary for fine pattern formation of the present invention which was prepared by using a modified PVA with extremely low amount of a high molecular weight body component compared with the auxiliary for fine pattern formation which was prepared by using a modified PVA prepared without carrying out a heat-treatment or an appropriate heat-treatment and having over 1000 ppm of amount of a high molecular weight body component and the auxiliary for fine pattern formation of the present invention had extremely excellent characteristics.

[Evaluation of Stability with Time]

EXAMPLE 7

Polymer B was stored at the room temperature (25° C.) and at a low temperature (5° C.) for two weeks and for one month. Thereafter an amount of a high molecular weight body component in Polymer B was measured respectively by GPC. The results were shown in Table 3.

COMPARATIVE EXAMPLE 5

1 kg of 10 weight % aqueous solution of Polymer a of the Production Example, which was not ion-exchange treated, was put into a three neck flask and heat-treated in an oil bath at 100° C. for 180 minutes to obtain Polymer F. The amount of a high molecular weight body component in Polymer F was measured by GPC in the same manner as Example 1 and was a good result as 100 ppm or less. Polymer F was stored at the room temperature (25° C.) and at a low temperature (5° C.) for two weeks and for one month, thereafter each amount of a high molecular weight body component was measured by GPC. The results were shown in Table 3.

TABLE 3

Results of test for stability with time (Amount of a high molecular weight body component (ppm))

| | | After storage for 2 weeks | | After storage for 1 month | |
|---|---|---|---|---|---|
| | Before storage | Storage at 5° C. | Storage at 25° C. | Storage at 5° C. | Storage at 25° C. |
| Example 7 | 100 or less | 100 | 200 | 200 | 200 |
| Comparative Example 5 | 100 or less | 4000 | 5800 | 9900 | 10800 |

From Table 3, it is seen that the modified PVA excellent in stability with time could be supplied by carrying out impurities removal step.

ADVANTAGES OF THE INVENTION

As mentioned above in detail, an auxiliary for fine pattern formation which has excellent characteristics such as good filterability and less defects upon application or a pattern formation, the raw material thereof and a production method of the raw material polymer are proposed by the present invention. Furthermore an auxiliary for fine pattern formation which is excellent in stability with time, a raw material polymer thereof and a production method of the raw material polymer can be offered by the present invention. Thereby in a fine processing for electronic parts such as a semiconductor or a production of a three-dimensional fine structured article, the pattern with less size than a limit resolution of a light-exposure wavelength can be formed with a high accuracy and a high throughput in accordance with a design rule as designed.

INDUSTRIAL APPLICABILITY

The auxiliary for fine pattern formation of the present invention is used for forming a resist pattern with a pattern size of a resolution limit or less of a light-exposure wavelength in fine processing upon manufacturing electronic parts such as a semiconductor and so on or a three-dimensional fine structured article such as a micro machine. Further the modified polyvinyl alcohol of the present invention is preferably used as a material constituting the above auxiliary for fine pattern formation.

The invention claimed is:

1. An auxiliary for fine pattern formation comprising a modified polyvinyl alcohol protected with a protecting group, a water-soluble crosslinking agent, and water or a mixed solvent of water and a water-soluble organic solvent, wherein the amount of high-molecular weight body components of the modified polyvinyl alcohol protected with a protecting group, which has a weight-average molecular weight of 250,000 or more as determined by polyethylene glycol standards according to a gel permeation chromatography, is 1000 ppm or less in the modified polyvinyl alcohol.

2. The auxiliary for fine pattern formation according to claim 1, wherein the modified polyvinyl alcohol protected with a protecting group is one that was treated so as to remove acid components and metal ions therefrom.

3. The auxiliary of claim 1, where the protecting group is selected from a formyl group, an acetyl group, a malonyl group, a benzoyl group, a cynnamoyl group, a formal group, an acetyl group, a butyral group, a t-butoxycarbonyl group and an ethoxyethylene group.

4. The auxiliary of claim 1, where the water-soluble crosslinking agent is selected from melamine derivatives, guanamine derivatives, urea derivatives, glycol uril, and alkoxy alkylated amino resin.

5. The auxiliary of claim 1, where the water-soluble organic solvent is capable of being dissolved at 0.1% by weight or more in water.

6. The auxiliary of claim 1, where the water-soluble organic solvent is selected from alcohols, ketones, esters, ethylene glycol monoalkyl ethers, ethylene glycol monoalkyl ether acetates, propylene glycol monoalkyl ethers, propylene glycol monoalkyl ether acetates, lactic esters, aromatic hydrocarbons, amides, lactones and mixtures thereof.

7. The auxiliary of claim 1, where the modified polyvinyl alcohol protected with a protecting group is heat treated after removing acid components and metal ions from the solution.

8. The auxiliary of claim 1, where the modified polyvinyl alcohol protected with a protecting group is heat treated at a temperature of 80° C. or more.

9. The auxiliary of claim 2, where the acid components and metal ions are removed using an ion exchange resin.

* * * * *